(12) United States Patent
Sun et al.

(10) Patent No.: US 11,005,567 B2
(45) Date of Patent: May 11, 2021

(54) EFFICIENT MULTI-MODE DFE

(71) Applicant: CREDO TECHNOLOGY GROUP LIMITED, Grand Cayman (KY)

(72) Inventors: Junqing Sun, Fremont, CA (US); Haoli Qian, Fremont, CA (US)

(73) Assignee: CREDO TECHNOLOGY GROUP LIMITED, Grand Cayman (KY)

( * ) Notice: Subject to any disclaimer, the term of this patent is extended or adjusted under 35 U.S.C. 154(b) by 210 days.

(21) Appl. No.: 16/459,491

(22) Filed: Jul. 1, 2019

(65) Prior Publication Data

US 2021/0006335 A1    Jan. 7, 2021

(51) Int. Cl.
*H04B 10/294* (2013.01)
*H04B 10/58* (2013.01)
*H04B 10/61* (2013.01)
*H04B 10/40* (2013.01)
*H03H 7/30* (2006.01)
*H04B 1/10* (2006.01)
*H04L 25/03* (2006.01)

(52) U.S. Cl.
CPC .......... *H04B 10/2941* (2013.01); *H03H 7/30* (2013.01); *H04B 1/10* (2013.01); *H04B 10/40* (2013.01); *H04B 10/58* (2013.01); *H04B 10/614* (2013.01); *H04L 25/03* (2013.01)

(58) Field of Classification Search
CPC .. H04B 10/2941; H04B 10/58; H04B 10/614; H04B 10/40; H04B 1/10; H03H 7/30; H04L 25/03
USPC ......................................................... 359/337
See application file for complete search history.

(56) References Cited

U.S. PATENT DOCUMENTS

| | | | | |
|---|---|---|---|---|
| 4,644,562 A * | 2/1987 | Kavehrad | .............. | H04B 7/002 375/232 |
| 7,050,517 B1 * | 5/2006 | Sallaway | ................. | H04B 3/23 375/350 |
| 8,102,910 B2 * | 1/2012 | Zhong | ............... | H04L 25/03057 375/233 |

(Continued)

OTHER PUBLICATIONS

Information Technology—Open Systems Interconnection—Basic Reference Model: The Basic Model, 1994.

(Continued)

*Primary Examiner* — Abbas H Alagheband
(74) *Attorney, Agent, or Firm* — Ramey & Schwaller LLP; Daniel J. Krueger (57) ABSTRACT

An illustrative SerDes receiver includes: a front-end filter, a precomputation unit, a selection element, and a controller. The front end filter converts a receive signal into a linearly-equalized signal. The precomputation unit accepts the linearly-equalized signal with or without a subtracted feedback signal, and employs a set of comparators with threshold values that depend on a first post-cursor ISI value $F_1$, the set of comparators operating to generate a set of tentative symbol decisions. The selection element derives a selected symbol decision from each set of tentative symbol decisions, thereby deriving a sequence of symbol decisions from the receive signal. The controller constrains $F_1$ if the receive signal uses a PAM4 signal constellation, setting $F_1$ to equal zero if the receive signal is conveyed via a low-loss channel and to equal one if the receive signal is conveyed via a high-loss channel.

16 Claims, 6 Drawing Sheets

(56) References Cited

U.S. PATENT DOCUMENTS

| | | | | |
|---|---|---|---|---|
| 8,301,036 | B2* | 10/2012 | He | H04L 25/03019 |
| | | | | 398/202 |
| 8,325,793 | B2* | 12/2012 | Zhong | H04L 25/03019 |
| | | | | 375/233 |
| 9,071,479 | B2* | 6/2015 | Qian | H04L 25/03057 |
| 9,137,063 | B2* | 9/2015 | Zerbe | H04L 1/0026 |
| 9,379,920 | B1* | 6/2016 | Liao | H04L 25/03878 |
| 9,385,859 | B2 | 7/2016 | Kuan et al. | |
| 9,935,800 | B1* | 4/2018 | He | H04L 27/01 |
| 10,686,583 | B2* | 6/2020 | Ulrich | H04L 25/03 |
| 10,848,350 | B1* | 11/2020 | Hossain | H04L 7/0087 |
| 2003/0086515 | A1* | 5/2003 | Trans | H04B 1/00 |
| | | | | 375/346 |
| 2006/0203900 | A1* | 9/2006 | Koralek | H04L 25/03267 |
| | | | | 375/233 |
| 2013/0343400 | A1 | 12/2013 | Lusted et al. | |
| 2014/0086264 | A1 | 3/2014 | Lusted et al. | |
| 2014/0146833 | A1 | 5/2014 | Lusted et al. | |
| 2015/0003505 | A1 | 1/2015 | Lusted et al. | |
| 2016/0337114 | A1 | 11/2016 | Baden et al. | |
| 2017/0222840 | A1* | 8/2017 | Malhotra | H04L 25/03057 |
| 2020/0076651 | A1 | 3/2020 | Sun et al. | |

OTHER PUBLICATIONS

International Search Report dated Dec. 6, 2017 in International Application No. PCT/CN2017/075961.
Non-Final Office Action dated Jan. 24, 2018 in U.S. Appl. No. 15/487,045.
Reed-Solomon Forward Error Correction (RS-FEC) Sublayer for 100GBASE-R PHYs.
Notice of Allowance dated Jun. 8, 2018 in U.S. Appl. No. 15/487,045.
"Physical Coding Sublayer (PCS) for 64B/66B, type 50GBASE-R" Draft Amendment to IEEE Std 802.3-2015, Feb. 3, 2017, pp. 132-141, 10 pgs.
"Physical Medium Attachment (PMA) sublayer, Physical Medium Dependent (PMD) sublayer, and baseband medium, type 1000GBASE-KP4," IEEE Standard for Ethernet, Section Six, pp. 481-519, 39 pgs.
"Physical Medium Dependent (PMD) sublayer and baseband medium, type 50GBASE-CR, 100GBASE-CR2, and 200GBASE-CR4," Draft Amendment to IEEE Std 802.3-2015, Feb. 3, 2017, pp. 184-215, 32 pgs.
"Reed-Solomon Forward Error Correction (RS-FEC) sublayer for 50GBASE-R PHYs," Draft Amendment to IEEE Std 802.3-2015, Feb. 3, 2017, pp. 142-159, 18 pgs.

* cited by examiner

EFFICIENT MULTI-MODE DFE

BACKGROUND

Digital communications occur between sending and receiving devices over an intermediate communications medium, or "channel" (e.g., a fiber optic cable or insulated copper wires). Each sending device typically transmits symbols at a fixed symbol rate, while each receiving device detects a (potentially corrupted) sequence of symbols and attempts to reconstruct the transmitted data. A "symbol" is a state or significant condition of the channel that persists for a fixed period of time, called a "symbol interval." A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by a sequence of two or more symbols.

Many digital communication links use only one bit per symbol; a binary '0' is represented by one symbol (e.g., an electrical voltage or current signal within a first range), and binary '1' by another symbol (e.g., an electrical voltage or current signal within a second range), but higher-order signal constellations are known and frequently used. In 4-level pulse amplitude modulation (PAM4), each symbol interval may carry any one of four symbols, denoted as −3, −1, +1, and +3. Two binary bits can thus be represented by each symbol.

Channel non-idealities produce dispersion which may cause each symbol to perturb its neighboring symbols, a consequence known as inter-symbol interference (ISI). ISI can make it difficult for the receiving device to determine which symbols were sent in each interval, particularly when such ISI is combined with additive noise.

To combat noise and ISI, receiving devices may employ various equalization techniques. Linear equalizers generally have to balance between reducing ISI and avoiding noise amplification. Decision Feedback Equalizers (DFE) are often preferred for their ability to combat ISI without inherently amplifying the noise. As the name suggests, a DFE employs a feedback path to remove ISI effects derived from previously-decided symbols.

A standard textbook implementation of a DFE employs a number of cascaded circuit elements to generate the feedback signal and apply it to the received input signal, all of which must complete their operation in less than one symbol interval. As symbol intervals continue to shrink, this implementation becomes infeasible with currently available silicon semiconductor processing technologies. Accordingly, alternative implementations have been proposed such as those disclosed in U.S. Pat. No. 8,301,036 ("High-speed adaptive decision feedback equalizer") and U.S. Pat. No. 9,071,479 ("High-speed parallel decision feedback equalizer"). These alternative implementations exploit the use of precomputation modules, which greatly increase the required number of fast comparators and hence greatly increase the receiver's power requirements. U.S. Pat. No. 9,935,800 ("Reduced complexity precomputation for decision feedback equalizer") discloses one technique for reducing the number of fast comparators, yet there remains further room for improvement.

SUMMARY

Accordingly, there is provided herein an embodiment of a SerDes receiver having: a front-end filter, a precomputation unit, a selection element, and a controller. The front end filter is configured to convert a receive signal into a linearly-equalized signal. The precomputation unit is coupled to accept the linearly-equalized signal with or without a subtracted feedback signal, and it employs a set of comparators with threshold values that depend on a first post-cursor inter-symbol interference (ISI) value $F_1$, the set of comparators operable to generate a set of tentative symbol decisions. The selection element derives a selected symbol decision from each set of tentative symbol decisions, thereby deriving a sequence of symbol decisions from the receive signal. The controller is configured to constrain the first post-cursor ISI value $F_1$ if the receive signal uses a PAM4 signal constellation, setting $F_1$ to equal zero if the receive signal is conveyed via a low-loss channel and to equal one if the receive signal is conveyed via a high-loss channel.

There is further provided an embodiment of an equalization method including: (a) supplying a front end filter configured to convert a receive signal into a linearly-equalized signal; (b) coupling the linearly-equalized signal to a set of comparators in a precomputation unit, the set of comparators using threshold values that depend on a first post-cursor inter-symbol interference (ISI) value $F_1$, the set of comparators operable to generate a set of tentative symbol decisions; (c) providing a selection element to derive a selected symbol decision from each set of tentative symbol decisions, thereby deriving a sequence of symbol decisions from the receive signal; and (d) configuring a controller to constrain the first post-cursor ISI value $F_1$ if the receive signal uses a PAM4 signal constellation, the controller constraining the first post-cursor ISI value $F_1$ to equal zero if the receive signal is conveyed via a low-loss channel and to equal one if the receive signal is conveyed via a high-loss channel.

Each of the foregoing embodiments may be implemented individually or conjointly, and together with any one or more of the following features in any suitable combination: 1. said configuring includes configuring the controller to leave the first post-cursor ISI value $F_1$ unconstrained to integers if the receive signal doesn't use a PAM4 signal constellation. 2. the set of comparators does not exceed eight comparators. 3. the precomputation unit provides multi-tap precomputation if the receive signal uses non-return to zero (NRZ) signaling. 4. determining whether the channel is a high-loss channel. 5. said determining includes: adapting the threshold values using NRZ training data; and determining that the channel is a high-loss channel if the threshold values correspond to a first post-cursor ISI value $F_1$ in excess of 0.6. 6. disabling one or more of said comparators when constraining the first post-cursor ISI value $F_1$ to equal zero. 7. configuring the selection element to derive the selected symbol decision from only enabled comparators in the precomputation unit. 8. said coupling the linearly-equalized signal to the set of comparators includes subtracting a feedback signal from the linearly-equalized signal. 9. the controller is configured to disable the feedback filter if the receive signal uses a PAM4 signal constellation. 10. the controller is configured to adjust a cursor position for training the front end filter when constraining the first post-cursor ISI value $F_1$. 11. the controller adjusts the thresholds to account for channel nonlinearities if the receive signal uses a PAM4 signal constellation and the receive signal is conveyed via a low-loss optical channel. 12. the controller is further configured to determine whether the channel is a high-loss channel.

DETAILED DESCRIPTION

Note that the specific embodiments given in the drawings and following description do not limit the disclosure. On the contrary, they provide the foundation for one of ordinary skill to discern the alternative forms, equivalents, and modifications that are encompassed in the claim scope.

Figure 1:
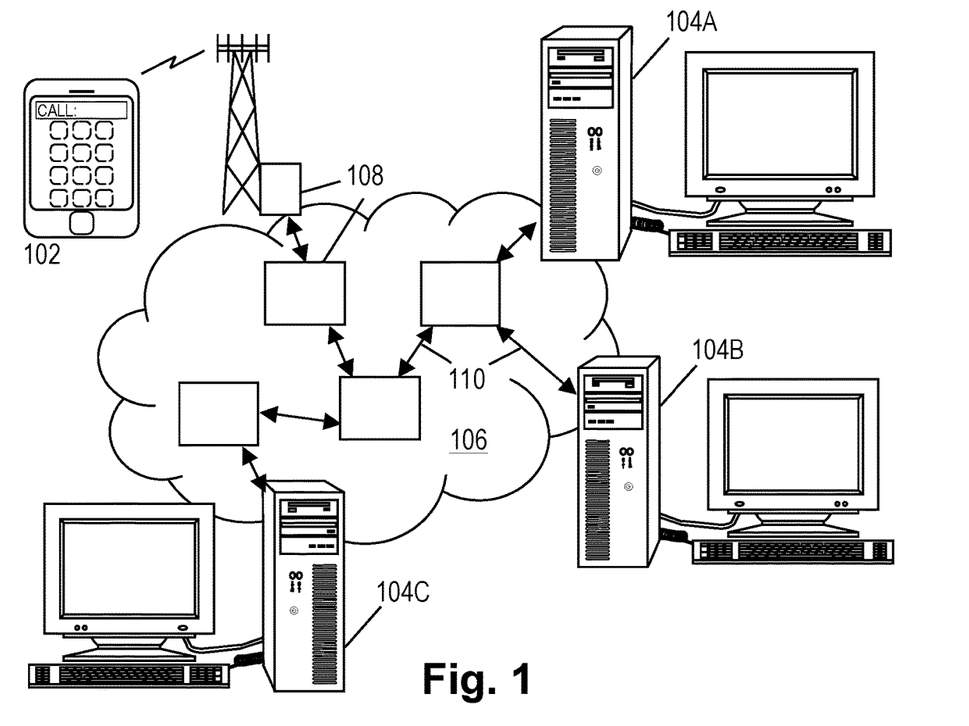
FIG. 1 shows an illustrative computer network.

The disclosed apparatus and methods are best understood in the context of the larger environments in which they operate. Accordingly, FIG. 1 shows an illustrative communications network 100 including mobile devices 102 and computer systems 104A-C coupled via a routing network 106. The routing network 106 may be or include, for example, the Internet, a wide area network, or a local area network. In FIG. 1, the routing network 106 includes a network of equipment items 108, such as switches, routers, and the like. The equipment items 108 are connected to one another, and to the computer systems 104A-C, via point-to-point communication links 110 that transport data between the various network components.

Figure 2:
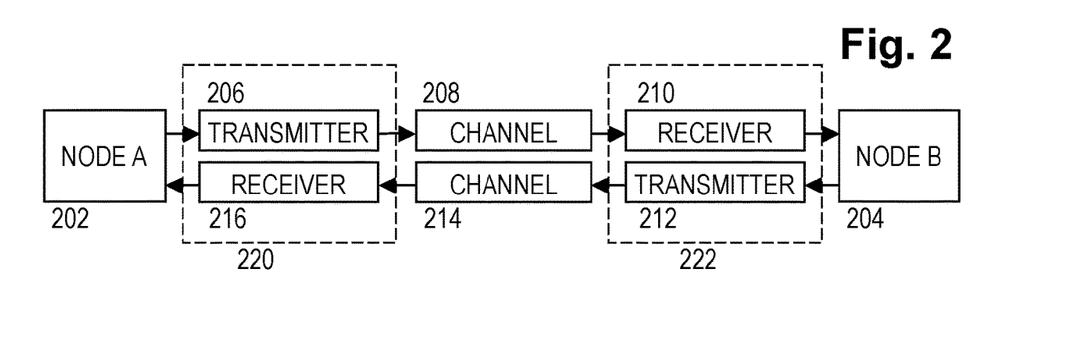
FIG. 2 is a function-block diagram of an illustrative point-to-point communication link.

FIG. 2 is a diagram of an illustrative point-to-point communication link that may be representative of links 110 in FIG. 1. The illustrated embodiment includes a first node 202 ("Node A") in communication with a second node 204 ("Node B"). Nodes A & B can each be, for example, any one of mobile devices 102, equipment items 108, computer systems 104A-C, or other sending/receiving devices suitable for high-rate digital data communications.

Coupled to Node A is a transceiver 220, and coupled to Node B is a transceiver 222. Communication channels 208 and 214 extend between the transceivers 220 and 222. The channels 208 and 214 may include, for example, transmission media such as fiber optic cables, twisted pair wires, coaxial cables, backplane transmission lines, and wireless communication links. (It is also possible for the channel to be a magnetic or optical information storage medium, with the write-read transducers serving as transmitters and receivers.) Bidirectional communication between Node A and Node B can be provided using separate channels 208 and 214, or in some embodiments, a single channel that transports signals in opposing directions without interference.

A transmitter 206 of the transceiver 220 receives data from Node A and transmits the data to the transceiver 222 via a signal on the channel 208. The channel signal may be, for example, an electrical voltage, an electrical current, an optical power level, a wavelength, a frequency, or a phase value. A receiver 210 of the transceiver 222 receives the signal via the channel 208, uses the signal to reconstruct the transmitted data, and provides the data to Node B. Similarly, a transmitter 212 of the transceiver 222 receives data from Node B, and transmits the data to the transceiver 220 via a signal on the channel 214. A receiver 216 of the transceiver 220 receives the signal via the channel 214, uses the signal to reconstruct the transmitted data, and provides the data to Node A.

Figure 3:
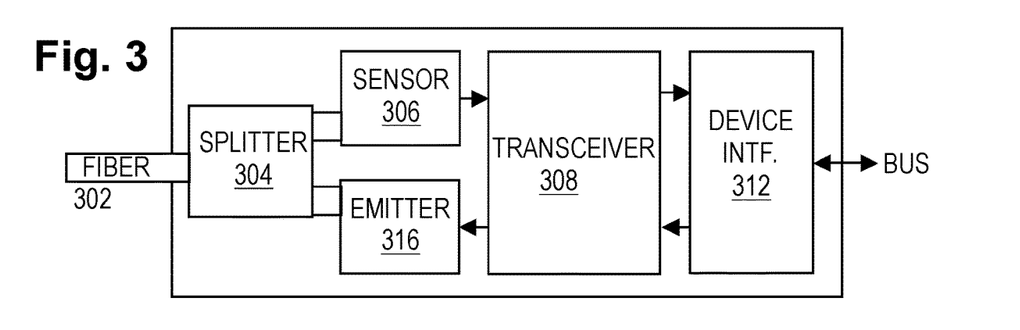
FIG. 3 is a function-block diagram of an illustrative fiber optic interface module.

FIG. 3 shows an illustrative transceiver embodiment in the context of a fiber optic interface module. An optical fiber 302 couples to the fiber optic interface module via a splitter 304 which creates two optical paths to the fiber: one for receiving and one for transmitting. A sensor 306 is positioned on the receiving path to convert one or more received optical signals into corresponding analog (electrical) receive signals that are amplified by amplifier 308 in preparation for processing by a multi-mode decision feedback equalizer (DFE) 310. The DFE 310 converts the received signal into a sequence of symbol decisions. A device interface 312 buffers the sequence of symbol decisions and, in at least some embodiments, includes forward error correction (FEC) decoding and payload extraction logic to derive a received data stream from the sequence of symbol decisions. The device interface 312 then makes the received data stream available to the host node via an internal data bus in accordance with a standard I/O bus protocol.

Conversely, data for transmission can be communicated by the host node via the bus to device interface 312. In at least some embodiments, the device interface 312 packetizes the data with appropriate headers and end-of-frame markers, optionally adding a layer of FEC coding and/or a checksum. Driver 314 accepts a transmit data stream from interface 312 and converts the transmit data stream into an analog electrical drive signal for emitter 316, causing the emitter to generate optical channel signals that are coupled via splitter 304 to the optical fiber 302.

In at least some contemplated embodiments, elements 308-314 are integrated into a monolithic transceiver chip together with a controller that provides link training and flow control logic. Additional detail for such embodiments is provided in co-pending application U.S. App. 62/723,701, "SerDes pre-equalizer having efficient adaptation", which is hereby incorporated herein by reference in its entirety. Alternatively the device interface 312 may incorporate the controller functionality. Regardless, the transceiver may be employed for communications over optical fiber, electrical conductors, wireless links, or other channel types.

Figure 4:
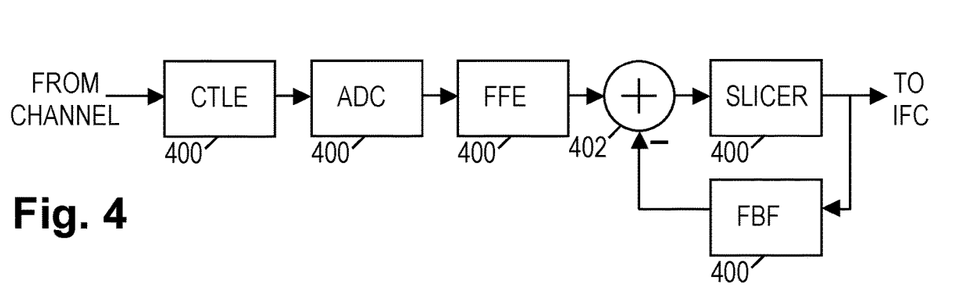
FIG. 4 shows an illustrative decision feedback equalizer (DFE) implementation.

As previously mentioned, a DFE is included in the receive chain to combat intersymbol interference (ISI) that results from signal dispersion in the channel. FIG. 4 shows an illustrative implementation of a DFE. In FIG. 4, an analog or digital front end filter 400 operates on the receive signal to shape the overall channel response of the system and minimize the effects of leading ISI on the current symbol. As part of the shaping of the overall channel response, the front end filter 400 may also be designed to shorten the channel response of the filtered signal and (as explained below) reduce a number of precomputation module comparator thresholds while minimizing any attendant noise enhancement. A summer 402 subtracts a feedback signal from the output of the front end filter 400 to minimize the effects of trailing ISI on the current symbol.

A decision element 404 employs a set of comparators 406 to digitize the combined signal and produce a stream of output data (denoted Ak, where k is the time index). In the illustrated example, the symbols are presumed to be PAM4 (−3, −1, +1, +3), so comparators 406A-406C accordingly employ the decision thresholds −2, 0, and +2, respectively. (The unit for expressing symbol and threshold values is omitted for generality, but for explanatory purposes may be presumed to be volts. In practice, a scale factor will be employed.) The comparator outputs can be taken collectively as a thermometer-coded digital representation of the output symbol decision, e.g., with 000 representing −3, 100 representing −1, 110 representing +1, and 111 representing +3. Textbook-style embodiments employ an optional digitizer to convert the comparator outputs into a binary number representation, e.g., 00 to represent −3, 01 to represent −1, 10 to represent +1, and 11 to represent +3. Alternatively, a Gray-coded representation could be employed. However, the illustrated thermometer-coded representation offers potential efficiency advantages despite its less compact form.

The DFE generates the feedback signal with a feedback filter 410 having a series of delay elements 412 (e.g., latches, flip flops, or registers) that store the recent output symbol decisions ($A_{k-1}, A_{k-2}, \ldots, A_{k-N}$, where N is the number of filter coefficients Fi). A set of multipliers 414 determines the product of each symbol with a corresponding filter coefficient, and a series of summers 416 combines the products to obtain the feedback signal.

The feedback filter 410 is shown having an enable input EN that is active-low. When driven high, the feedback filter 410 is disabled and the feedback signal is driven to zero or, depending on the implementation, to a high-impedance state that is equivalent to having no feedback signal. Where the signal-to-noise ratio (SNR) of the received signal is relatively high, the DFE offers essentially no performance gain over a linear equalizer. In such circumstances, the feedback filter may be disabled to reduce power consumption. Note that the "cursor" position for training the front end filter 400 may be adjusted to enable it to provide optimal linear equalization performance.

As an aside, we note here that the circuitry for the front end filter 400 and the feedback filter 410 can operate on analog signals, or conversely, it can be implemented using digital circuit elements and/or software in a programmable processor. Further, a timing recovery unit and a filter coefficient adaptation unit augment the operation of the DFE, but such considerations are addressed in the literature and generally known to those skilled in the art. Nevertheless we note here that at least some contemplated embodiments include one or more additional comparators to be employed for comparing the combined signal to one or more of the extreme symbol values (−3, +3), thereby providing an error signal that can be used for timing recovery with, e.g., a "bang-bang" design. We further note that the adaptation unit may employ the error signal to adapt the coefficients of both the front end filter 400 and the feedback filter 410 during a training phase when a known symbol sequence is employed.

In the embodiment of FIG. 4, the feedback filter 410 must complete its operation in less than one symbol interval because its output depends in part upon the immediately preceding decision. At very high data rates, one symbol interval does not provide sufficient time to finish the filter multiplications and the feedback subtraction. Accordingly, one solution that has been proposed in the literature is "unrolling" the feedback filter.

Figure 5:
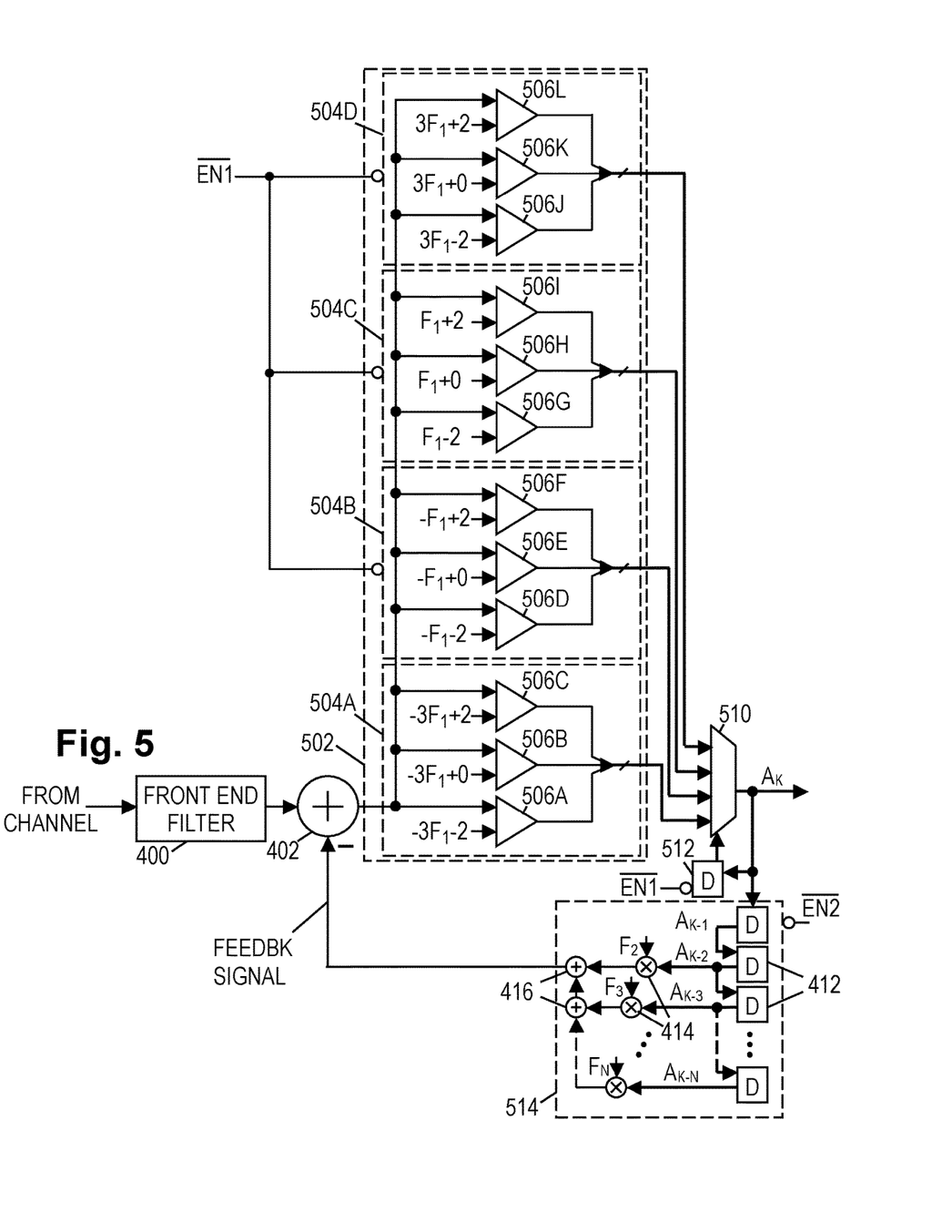
FIG. 5 shows an illustrative DFE employing a one-tap precomputation unit.

FIG. 5 shows an illustrative variation of FIG. 4 that unrolls the feedback filter by one tap. The embodiment of FIG. 5 employs the same front end filter 400, but summer 402 subtracts a feedback signal to remove the trailing ISI caused by all but the immediately preceding symbol. For each possible value of the immediately preceding symbol, the precomputation unit 502 provides a decision element 504A-504D. Decision element 504A speculatively assumes that the preceding symbol was −3, and rather than subtracting the ISI that would result from this symbol (−3*$F_1$, where $F_1$ is the coefficient of the first tap in the textbook feedback filter 410), the thresholds of comparators 506A-506C have been adjusted relative to the thresholds of comparators 406A-406C by adding −3*$F_1$, enabling decision element 504A to form a tentative symbol decision based on this speculative assumption.

Similarly, decision elements 504B, 504C, and 504D employ comparators with suitably adjusted thresholds to render tentative decisions under the speculative assumptions that the preceding symbol was −1, +1, and +3, respectively. The precomputation unit 502 supplies these tentative decisions to a multiplexer 510, which selects the proper tentative decision based on the immediately preceding symbol decision $A_{k-1}$, which is stored by delay element 512. Feedback filter 514 has a reduced number of taps (filter coefficients), but otherwise operates similarly to feedback filter 410.

Although this unrolling step increases the number of elements in the DFE loop (i.e., in the loop including summer 402, precomputation unit 502, multiplexer 510, delay element 512, and feedback filter 514), only the elements of the inner loop (i.e., the loop including multiplexer 510 and delay element 512) need to achieve their operations in less than one symbol interval. The remaining DFE loop elements can take up to two symbol intervals to complete their pipelined operation. If it is still a challenge to complete the feedback filter operation in time, further unrolling can be performed.

As with the embodiment of FIG. 4, there may be channels with sufficient SNR for linear equalization to suffice alone or with partial decision feedback. Setting feedback filter coefficient $F_1$=0, perhaps combined with adjusting the cursor position for training, enables the front end filter 400 to account for one interval of trailing (aka "post-cursor") ISI. With $F_1$ constrained to be zero, each of the decision elements is equivalent, enabling all but one of them to be disabled by enable signal EN1 to conserve power. The enable signal EN1 further sets the multiplexer 510 to pass only the decisions from the sole enabled decision element 504A. If desired, the same enable signal EN1 or a second enable signal EN2 may further disable the partial feedback filter 514 to provide further power conservation, though the bulk of the power savings is expected to be achieved by disabling the unnecessary comparators 506D-506L. As with the embodiment of FIG. 4, the cursor position for training the front end filter may be adjusted to provide optimal linear equalization performance when the feedback filter is entirely disabled.

Figure 6:
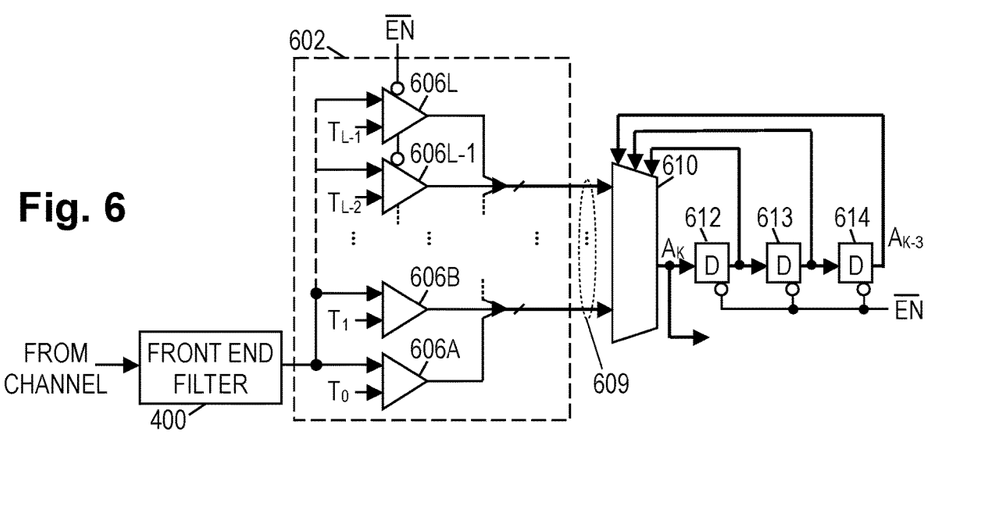
FIG. 6 shows an illustrative DFE with a fully-unrolled precomputation unit.

The disclosed principles may be extended as shown in FIG. 6, which shows an illustrative variation in which a 3-tap feedback filter has been completely unrolled. This embodiment still employs front end filter 400, but the summer 402 is eliminated since the feedback filter has been completely unrolled. Its function has been fully supplanted by precomputation unit 602, which provides a separate decision element for each combination of the three preceding symbols. The digitizers 608A-608M supply the tentative decisions 609 to a large multiplexer 610, which selects one tentative decision from the set based on the three preceding symbol decisions held in delay elements 612, 613, 614, thereby producing the sequence of symbol decisions Ak.

Where the cardinality of the symbol set is P and the number of feedback filter coefficients is N, the number of decision elements in the precomputation unit 602 is $M=P^N$. Thus, for a PAM4 system (i.e., P=4) with a 3-tap feedback filter, the number of decision elements would be $4^3=64$. As each decision element employs P−1 comparators, the precomputation unit employs $L=(P-1)P^N$ comparators, or 192 comparators for the 3-tap PAM4 DFE example. Thus with each increase in the length of trailing ISI and each increase in symbol set cardinality, the size of the precomputation unit grows exponentially, as does the size of the multiplexer 610.

Again, the DFE may be fully or partly disabled for channels where the front end filter 400 can provide adequate linear equalization performance. The unneeded comparators 606 can be disabled by the enable signal EN and the multiplexer 610 set to select from just the enabled sets of tentative decisions 609. Depending on the desired complexity, the level of DFE precomputation can be graduated as desired to tailor the power consumption to the equalization requirements of the channel.

While such unrolling can address timing constraints on the feedback filter, the operating time required by the inner loop (multiplexer 610 and delay element 612) may become the limiting factor at very high data rates. In other words, for any given semiconductor process, the propagation delay of the multiplexer becomes a bottleneck to the loop-unrolling approach as the data rate increases. U.S. Pat. No. 8,301,036 ("High-speed adaptive decision feedback equalizer") and U.S. Pat. No. 9,071,479 ("High-speed parallel decision feedback equalizer") address this issue with parallelization techniques, which are specifically contemplated for use with the reduced complexity computation units disclosed herein. To that end, the disclosures of these two patents are hereby incorporated herein in their entirety.

Figure 7:
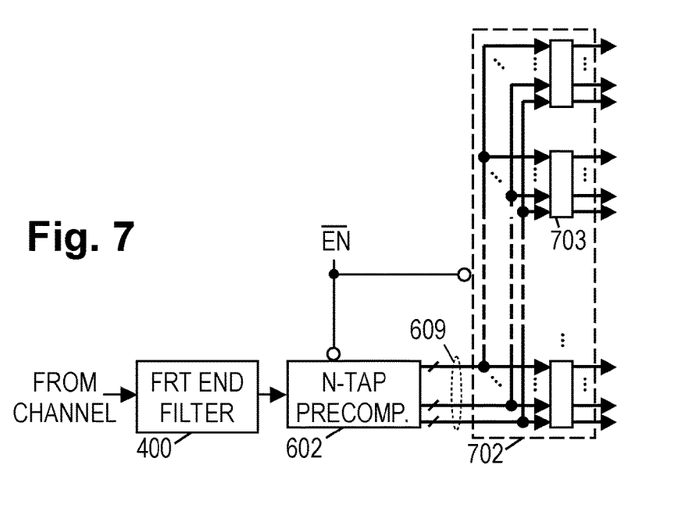
FIG. 7 shows an illustrative DFE front end that produces a parallel array of precomputed signal sets.

Some of these parallelization techniques can be employed by adapting the DFE as illustrated in FIG. 7. The set of tentative decisions 609 provided by the precomputation unit 602 are supplied to a serial-to-parallel converter 702 having a series of registers 703. The registers 703 latch in a round-robin fashion to capture each tentative decision set as it becomes available and to hold it for as long as necessary for subsequent processing, i.e., up to Q symbol intervals, where Q is the number of registers. Other implementations of serial-to-parallel conversion units are known and can be used. Some implementations provide the captured set of tentative decisions as output upon capture, whereas others may store the captured sets to be output simultaneously as a whole group.

As with previous embodiments, an enable signal EN permits unnecessary comparators to be disabled, and may optionally reconfigure operation of the serial-to-parallel converter to operate on only the tentative decisions from enabled comparators.

While the feedback filter can be partially or completely disabled for low-loss channels as discussed previously, it is infeasible to do so for high loss channels. Yet it may be infeasible to provide the necessary number of fast comparators for the precomputation unit for PAM4 and higher-order constellations. U.S. Pat. No. 9,935,800 ("Reduced complexity precomputation for decision feedback equalizer"), which is incorporated herein by reference, discloses one technique for reducing the number of fast comparators that is particularly useful for multi-tap precomputation of low-order constellations (e.g., non-return to zero or "NRZ"), yet there remains further room for improvement.

As signaling rates increase, the trailing ISI corresponding to the first feedback filter coefficient $F_1$ becomes increasingly comparable to the (normalized) receive signal amplitude at the cursor (i.e., at the nominal symbol position). In other words, if the channel response at the cursor is taken to equal unity, the trailing ISI at the first post-cursor position also approaches unity as the signaling rate increases. At this point, attempting to constrain $F_1$ to equal zero with linear equalization would cause too much noise enhancement, so at least some degree of precomputation is desired. In such circumstances, the front end filter may be trained with the first feedback filter coefficient constrained to equal one ($F_1=1$). If the remainder of the feedback filter is disabled (equivalent to setting the remaining feedback filter coefficients to zero), this equalized response is called a "1+D" partial response.

Figure 8A:
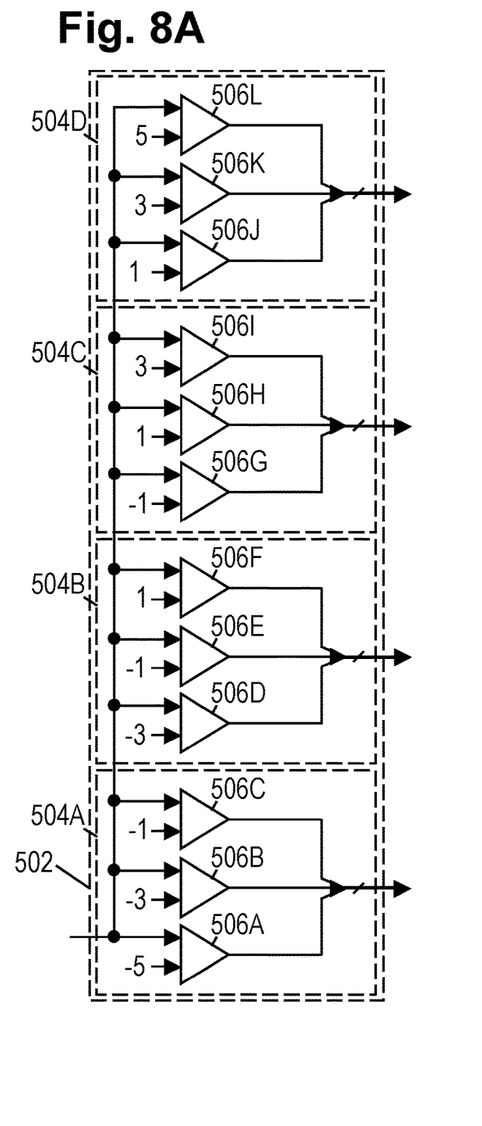
FIG. 8A shows a precomputation unit with illustrative threshold values.
Figure 8B:
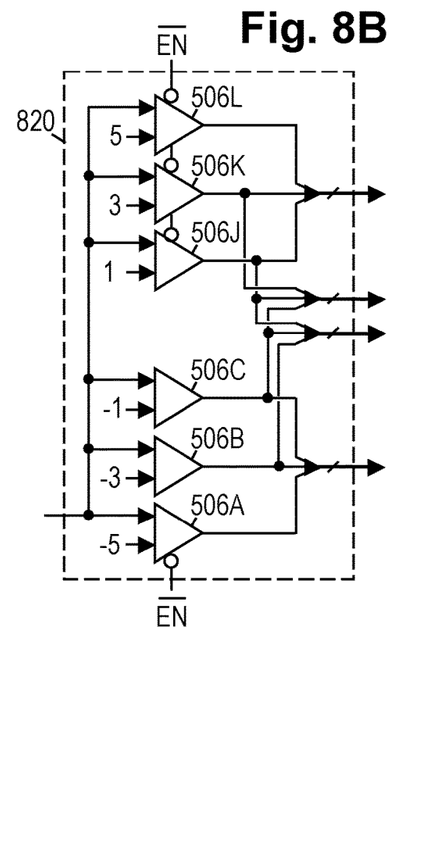
FIG. 8B shows an illustrative reduced-complexity precomputation unit.

FIG. 8A shows an illustrative 1-tap PAM4 precomputation unit 502 having 12 computation units and 12 corresponding threshold values for a trailing ISI coefficient of $F_1=1$. Note that this constraint provides a high degree of overlap in the threshold values, making half of the comparators redundant. FIG. 8B shows a reduced complexity precomputation unit 820 with the redundant comparators eliminated and with the outputs of the remaining comparators shared and grouped as necessary to provide the full set of tentative symbol decisions. Precomputation unit 820 can be employed in any of the DFE designs shown in FIGS. 5-7, and may be equipped with an enable signal to disable unneeded comparators when employed for equalizing a low-loss channel where $F_1$ may be constrained to be zero. The value of $F_1$ determines the comparator thresholds as indicated in FIG. 5, and when constrained to zero or one, the number of needed comparators for the precomputation unit is three or six, respectively.

The six fast comparators of precomputation unit 820 can thus be employed in multiple ways. For NRZ signal constellations, four of the comparators can be employed for an exact two-tap precomputation unit or, using the principles set out in U.S. Pat. No. 9,935,800, for a reduced-complexity three-tap precomputation unit. Alternatively, the precomputation unit 820 may be designed with eight fast comparators for an exact three-tap precomputation unit. For PAM4 signal constellations in high-rate channels, the six comparators can be employed with $F_1=1$ for an exact one-tap precomputation unit. For PAM4 signal constellations in low-loss channels where $F_1$ may be constrained to be zero, three of the comparators may be disabled to reduce power consumption.

The foregoing principles are applicable to both electrical and optical channels. However, it should be noted that certain optical channels may create nonlinearities in the channel response to PAM4 signaling, such that the thresholds may depend on the preceding symbol in a way that reduces the number of overlapping thresholds even if the front end filter is trained with $F_1$ constrained to be 0. In this case, the extra comparators may be employed to account for these nonlinearities as residual ISI.

Thus even if employing a precomputation unit limited to six fast comparators to conserve power, receivers equipped with the disclosed DFEs are suitable for multiple channel types including short-reach, long-reach, and optical links. The power savings obtained by reducing the number of fast comparators may be used to improve performance in other ways, including lengthening the front end filter and/or providing additional taps in the feedback filter to correct the residual trailing ISI. The reduced complexity of the design may further enable implementations for even higher signaling rates.

Figure 9:
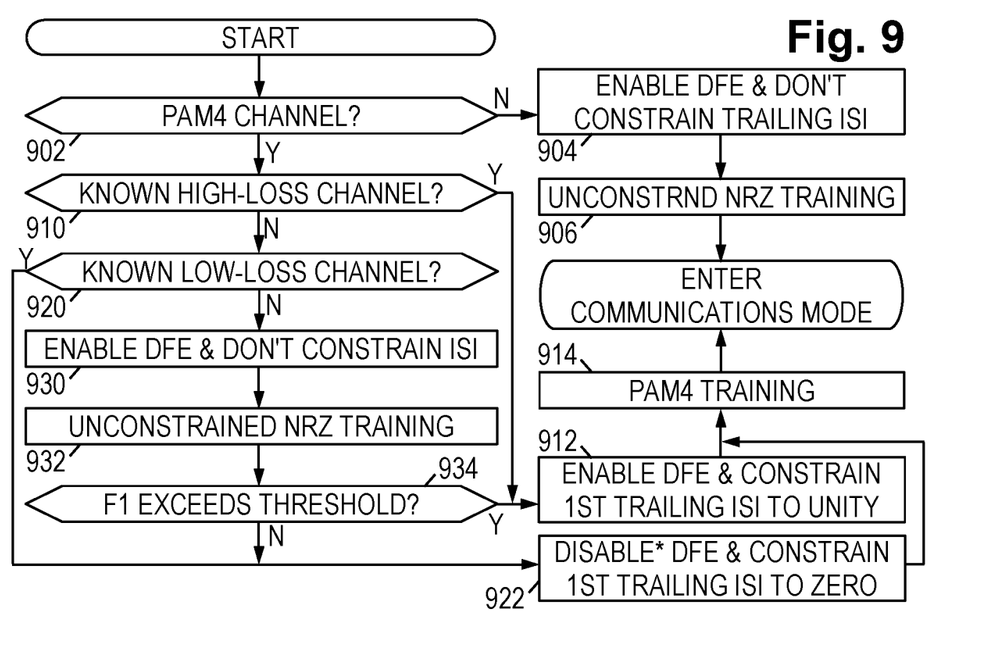
FIG. 9 is a flowchart of an illustrative method for high-rate receiver equalization.

FIG. 9 is a flowchart of an illustrative method for providing a high-speed receiving device with adaptable DFE-based equalization. The method may be implemented at the factory by automated equipment, e.g., as part of an active cable assembly, or in the field by firmware executed in the receiver or transceiver device's controller. The method presumes that the receiver has been manufactured with the disclosed precomputation unit in a suitable DFE design such as those discussed above with reference to FIGS. 5-7. The method begins in block 902 with a determination of whether the signal constellation for the channel is PAM4 or NRZ. In at least some embodiments, this determination is based on a parameter value set in a configuration register. If the constellation is NRZ, the method proceeds in block 904 with the controller enabling the full precomputation unit and feedback filter and allowing the first feedback filter coefficient ($F_1$) to adapt. In block 906, a sequence of NRZ training data is communicated across the channel, which the controller may use to adapt the filter coefficients in both the front end filter and feedback filters (including the precomputation unit thresholds). Once training is complete, the controller enables the receiver to enter the communications mode to begin receiving data across the channel.

If, in block 902, it is determined that the signal constellation is PAM4, the controller determines in block 910 whether the channel is known to be a high-loss channel, i.e., a channel with dispersion above, say, 25 dB. (Channels with dispersion of 25 dB or less may be termed "short reach channels", as contrasted with "long reach channels" having higher dispersions.) If so, the controller in block 912 enables the full precomputation unit and feedback filter, with the first filter coefficient constrained to unity ($F_1$=1). In block 914, a sequence of PAM4 training data is communicated across the channel, which the controller may use to adapt the remaining filter coefficients in both the front end filter and feedback filters. Once training is complete, the controller enables the receiver to enter the communications mode to begin receiving data across the channel.

If, in block 910, the channel is not known to be a high-loss channel, the controller determines in block 920 whether the channel is know to be a low-loss channel. If so, in block 922 the controller constrains the first feedback filter coefficient to zero ($F_1$=0), disabling the redundant comparators in the precomputation unit and optionally disabling the feedback filter. Alternatively, if the channel is known to be an optical channel with non-linearities, the controller may configure the "redundant" comparators to account for the channel nonlinearities as discussed previously. The method proceeds in block 914 with training on PAM4 data enabling the controller to adapt the remaining filter coefficients in the front end filter and, if enabled, the feedback filter.

If, in block 920, the channel isn't known to be low-loss, the controller in block 930 tentatively enables the precomputation unit and feedback filter with no constraints on the filter coefficients. In block 932, similar to block 906, a sequence of NRZ training data is communicated across the channel, which the controller uses to characterize the channel by, e.g., adapting the filter coefficients in both the front end filter and feedback filter (including the precomputation unit thresholds). In block 934, the controller determines whether the trailing ISI of the channel exceeds a predetermined threshold, e.g., 0.6. If so, the channel is determined to be a high-loss channel and the method proceeds with block 912. If not, the channel is determined to be a low-loss channel and the method proceeds with block 922. Other automated methods for channel characterization are set out in the literature and would be suitable for determining whether the channel is a high-loss or low-loss channel.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. A method for providing equalization, the method comprising:
supplying a front end filter configured to convert a receive signal into a linearly-equalized signal;
coupling the linearly-equalized signal to a set of comparators in a precomputation unit, the set of comparators using threshold values that depend on a first post-cursor inter-symbol interference (ISI) value $F_1$, the set of comparators operable to generate a set of tentative symbol decisions;
providing a selection element to derive a selected symbol decision from each set of tentative symbol decisions, thereby deriving a sequence of symbol decisions from the receive signal; and
configuring a controller to leave the first post-cursor 151 value $F_1$ unconstrained to integers if the receive signal doesn't use a PAM4 signal constellation, and otherwise to constrain the first post-cursor ISI value $F_1$ if the receive signal uses a PAM4 signal constellation, the controller constraining the first post-cursor ISI value $F_1$ to equal zero if the receive signal is conveyed via a low-loss channel and to equal one if the receive signal is conveyed via a high-loss channel.

2. The method of claim 1, wherein the set of comparators does not exceed eight comparators, and wherein the precomputation unit provides multi-tap precomputation if the receive signal uses non-return to zero (NRZ) signaling.

3. A method for providing equalization, the method comprising:
supplying a front end filter configured to convert a receive signal into a linearly-equalized signal;
coupling the linearly-equalized signal to a set of comparators in a precomputation unit, the set of comparators using threshold values that depend on a first post-cursor inter-symbol interference (ISI) value $F_1$, the set of comparators operable to generate a set of tentative symbol decisions;
providing a selection element to derive a selected symbol decision from each set of tentative symbol decisions, thereby deriving a sequence of symbol decisions from the receive signal; and
configuring a controller to constrain the first post-cursor ISI value $F_1$ if the receive signal uses a PAM4 signal constellation, the controller constraining the first post-cursor ISI value $F_1$ to equal zero if the receive signal is conveyed via a low-loss channel and to equal one if the receive signal is conveyed via a high-loss channel, and further configuring the controller to determine whether the channel is a high-loss channel, wherein said determining includes:
adapting the threshold values using NRZ training data; and
determining that the channel is a high-loss channel if the threshold values correspond to a first post-cursor ISI value $F_1$ in excess of a predetermined threshold.

4. A method for providing equalization, the method comprising:
supplying a front end filter configured to convert a receive signal into a linearly-equalized signal;
coupling the linearly-equalized signal to a set of comparators in a precomputation unit, the set of comparators using threshold values that depend on a first post-cursor inter-symbol interference (ISI) value $F_1$, the set of comparators operable to generate a set of tentative symbol decisions;
providing a selection element to derive a selected symbol decision from each set of tentative symbol decisions, thereby deriving a sequence of symbol decisions from the receive signal; and
configuring a controller to constrain the first post-cursor ISI value $F_1$ if the receive signal uses a PAM4 signal constellation, the controller constraining the first post-cursor ISI value $F_1$ to equal zero if the receive signal is conveyed via a low-loss channel and to equal one if the receive signal is conveyed via a high-loss channel, and further configuring the controller to disable one or more of said comparators when constraining the first post-cursor ISI value $F_1$ to equal zero; the selection element deriving the selected symbol decision from only enabled comparators in the precomputation unit.

5. The method of claim 1, wherein said coupling the linearly-equalized signal to the set of comparators includes subtracting a feedback signal from the linearly-equalized signal.

6. The method of claim 5, wherein the feedback signal is produced by a feedback filter, and wherein the controller is configured to disable the feedback filter if the receive signal uses a PAM4 signal constellation.

7. The method of claim 6, wherein the controller is configured to adjust a cursor position for training the front end filter when constraining the first post-cursor ISI value $F_1$.

8. The method of claim 1, wherein the controller adjusts the thresholds to account for channel nonlinearities if the receive signal uses a PAM4 signal constellation and the receive signal is conveyed via a low-loss optical channel.

9. A SerDes receiver that comprises:
a front end filter configured to convert a receive signal into a linearly-equalized signal;
a precomputation unit coupled to accept the linearly-equalized signal with or without a subtracted feedback signal, the precomputation unit having a set of comparators using threshold values that depend on a first post-cursor inter-symbol interference (ISI) value $F_1$, the set of comparators operable to generate a set of tentative symbol decisions;
a selection element configured to derive a selected symbol decision from each set of tentative symbol decisions, thereby deriving a sequence of symbol decisions from the receive signal; and
a controller configured to leave the first post-cursor ISI value $F_1$ unconstrained to integers if the receive signal doesn't use a PAM4 signal constellation, and otherwise configured to constrain the first post-cursor ISI value $F_1$ if the receive signal uses a PAM4 signal constellation, the controller constraining the first post-cursor ISI value $F_1$ to equal zero if the receive signal is conveyed via a low-loss channel and to equal one if the receive signal is conveyed via a high-loss channel.

10. The receiver of claim 9, wherein the set of comparators does not exceed eight comparators, and wherein the precomputation unit provides multi-tap precomputation if the receive signal uses non-return to zero (NRZ) signaling.

11. A SerDes receiver that comprises:
a front end filter configured to convert a receive signal into a linearly-equalized signal;
a precomputation unit coupled to accept the linearly-equalized signal with or without a subtracted feedback signal, the precomputation unit having a set of comparators using threshold values that depend on a first post-cursor inter-symbol interference (ISI) value $F_1$, the set of comparators operable to generate a set of tentative symbol decisions;
a selection element configured to derive a selected symbol decision from each set of tentative symbol decisions, thereby deriving a sequence of symbol decisions from the receive signal; and
a controller configured to constrain the first post-cursor ISI value $F_1$ if the receive signal uses a PAM4 signal constellation, the controller constraining the first post-cursor ISI value $F_1$ to equal zero if the receive signal is conveyed via a low-loss channel and to equal one if the receive signal is conveyed via a high-loss channel, wherein the controller is configured to:
adapt the threshold values using NRZ training data; and
determine that the channel is a high-loss channel if the threshold values correspond to a first post-cursor ISI value $F_1$ in excess of 0.6.

12. A SerDes receiver that comprises:
a front end filter configured to convert a receive signal into a linearly-equalized signal;
a precomputation unit coupled to accept the linearly-equalized signal with or without a subtracted feedback signal, the precomputation unit having a set of comparators using threshold values that depend on a first post-cursor inter-symbol interference (ISI) value $F_1$, the set of comparators operable to generate a set of tentative symbol decisions;
a selection element configured to derive a selected symbol decision from each set of tentative symbol decisions, thereby deriving a sequence of symbol decisions from the receive signal; and
a controller configured to constrain the first post-cursor ISI value $F_1$ if the receive signal uses a PAM4 signal constellation, the controller constraining the first post-cursor ISI value $F_1$ to equal zero if the receive signal is conveyed via a low-loss channel and to equal one if the receive signal is conveyed via a high-loss channel, wherein the controller is further configured to:
disable one or more of said comparators when constraining the first post-cursor ISI value $F_1$ to equal zero, the selection element deriving the selected symbol decision from only enabled comparators in the precomputation unit.

13. The receiver of claim 9, wherein the linearly-equalized signal is provided with the subtracted feedback signal.

14. The receiver of claim 13, wherein the feedback signal is produced by a feedback filter, and wherein the controller is configured to disable the feedback filter if the receive signal uses a PAM4 signal constellation.

15. The receiver of claim 14, wherein the controller is configured to adjust a cursor position for training the front end filter when constraining the first post-cursor ISI value $F_1$.

16. The receiver of claim 9, wherein the controller adjusts the thresholds to account for channel nonlinearities if the receive signal uses a PAM4 signal constellation and the receive signal is conveyed via a low-loss optical channel.

* * * * *